(12) United States Patent
Tanaka

(10) Patent No.: US 6,623,324 B2
(45) Date of Patent: Sep. 23, 2003

(54) METHOD FOR MANUFACTURING ORGANIC ELECTROLUMINESCENCE DEVICE

(75) Inventor: Taizou Tanaka, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/981,114

(22) Filed: Oct. 16, 2001

(65) Prior Publication Data
US 2002/0045397 A1 Apr. 18, 2002

(30) Foreign Application Priority Data
Oct. 17, 2000 (JP) ........................................ 2000-316419

(51) Int. Cl.$^7$ .................................................. H01J 9/00
(52) U.S. Cl. ........................... 445/24; 445/25; 313/512; 427/66; 427/557
(58) Field of Search ............................. 445/23, 24, 25; 313/512, 511; 427/66, 510, 516, 521, 557; 156/379.6, 379.7, 381, 382; 438/118, 119, 124, 126, 127

(56) References Cited

U.S. PATENT DOCUMENTS

| | | | |
|---|---|---|---|
| 4,961,886 A | * | 10/1990 | Eckstein et al. ............ 427/510 |
| 5,124,204 A | * | 6/1992 | Yamashita et al. .......... 313/506 |
| 5,821,692 A | * | 10/1998 | Rogers et al. ............... 313/512 |
| 5,962,962 A | * | 10/1999 | Fujita et al. ................. 313/512 |
| 6,080,031 A | * | 6/2000 | Rogers et al. ................. 445/25 |
| 6,103,541 A | * | 8/2000 | Yang et al. .................. 438/124 |
| 6,383,048 B1 | * | 5/2002 | Yang et al. .................... 445/24 |
| 6,520,821 B1 | * | 2/2003 | Ishii et al. ..................... 445/25 |

FOREIGN PATENT DOCUMENTS

| | | | |
|---|---|---|---|
| JP | 1-191075 | 8/1989 | ........... G01R/31/26 |
| JP | 4-79193 | 3/1992 | ........... H05B/33/10 |
| JP | 2002198173 | * 7/2002 | ........... H05B/33/10 |

* cited by examiner

Primary Examiner—Anthony Dinkins
Assistant Examiner—Angel R. Estrada
(74) Attorney, Agent, or Firm—Hayes Soloway P.C.

(57) ABSTRACT

A method for manufacturing an organic EL device is provided which is capable of preventing an occurrence of a leakage current caused by heat in an encapsulation process.

In the method for manufacturing the organic EL device, optical annealing is performed, before being encapsulated, by applying light with an irradiation wavelength $\lambda$ within a range of 300 nm to 500 nm to a transparent insulating substrate on which main components made up of an anode, hole transporting layer, organic light emitting layer, and cathode are formed.

13 Claims, 5 Drawing Sheets

FIG.4

| No. | irradiation wavelength (nm) | rectification ratio (at time of application of 10V) |
|---|---|---|
| 1 | 300 | $1.2 \times 10^8$ |
| 2 | 350 | $2.0 \times 10^8$ |
| 3 | 450 | $2.4 \times 10^8$ |
| 4 | 500 | $3.0 \times 10^8$ |

FIG.5

| No. | irradiation wavelength (nm) | rectification ratio (at time of application of 8V) |
|---|---|---|
| 1 | 200 | $5.0 \times 10^4$ |
| 2 | 250 | $4.6 \times 10^4$ |
| 3 | 550 | $4.2 \times 10^7$ |
| 4 | 600 | $2.2 \times 10^5$ |

FIG.6

| No. | irradiated amount of light ($\mu W/cm^2$) | rectification ratio (at time of application of 8V) |
|---|---|---|
| 1 | 0.1 | $1.0 \times 10^8$ |
| 2 | 1.0 | $1.0 \times 10^8$ |
| 3 | 10 | $2.0 \times 10^8$ |
| 4 | 100 | $2.2 \times 10^8$ |
| 5 | 1000 | $3.2 \times 10^8$ |

FIG.7

| No. | irradiated amount of light ($\mu W/cm^2$) | rectification ratio (at time of application of 8V) |
|---|---|---|
| 1 | 0.01 | $4.4 \times 10^6$ |
| 2 | 10000 | $5.2 \times 10^4$ |
| 3 | 100000 | $6.6 \times 10^2$ |

FIG.8

| No. | irradiation time (minute) | rectification ratio (at time of application of 8V) |
|---|---|---|
| 1 | 1.0 | $1.2 \times 10^8$ |
| 2 | 3.0 | $1.9 \times 10^8$ |
| 3 | 5.0 | $2.2 \times 10^8$ |
| 4 | 10 | $3.6 \times 10^8$ |
| 5 | 20 | $2.8 \times 10^8$ |
| 6 | 30 | $3.8 \times 10^8$ |

FIG.9

| No. | irradiation time (minute) | rectification ratio (at time of application of 8V) |
|---|---|---|
| 1 | 50 | $3.2 \times 10^6$ |
| 2 | 90 | $8.2 \times 10^5$ |
| 3 | 120 | $4.2 \times 10^4$ |

# METHOD FOR MANUFACTURING ORGANIC ELECTROLUMINESCENCE DEVICE

BACKGROUND OF THE INVENTION

1. Field of the Invention

The present invention relates to a method for manufacturing an organic EL (electroluminescence) device and more particularly to the method for manufacturing the organic EL device that can prevent an occurrence of a leakage current caused by heat in an encapsulation process.

The present application claims priority of Japanese Patent Application No.2000-316419 filed on Oct. 17, 2000, which is hereby incorporated by reference.

2. Description of the Related Art

As one type of EL devices to be used in a display device for information devices or a like, an organic EL device is developed. FIG. 10 is a schematic diagram showing configurations of a conventional organic EL device. The conventional organic EL device, as shown in FIG. 10, includes a transparent insulating substrate 51 made of a glass substrate or a like, an anode 52 (lower electrode) formed on the transparent insulating substrate 51 and made of transparent conductive materials such as ITO (Indium Tin Oxide), a hole transporting layer 53 formed on the anode 52, an organic light emitting layer 54 formed on the hole transporting layer 53, a cathode 55 (upper electrode) formed on the organic light emitting layer 54 and made of MgAg (magnesium silver) and a cap 57 made of glass or a like and mounted via a resin for encapsulation 56 on the transparent insulating substrate 51 on which main components including the anode 52, hole transporting layer 53, organic light emitting layer 54, and cathode 55 are formed, in a manner so as to cover the main components.

As the above resin for encapsulation 56, for example, a UV (Ultra-Violet ray curable resin is used and by irradiating the resin for encapsulation 56 with light containing UV fed from a light source, the resin for encapsulation 56 is cured and is used for encapsulation. At this point, in addition to the UV, heat is emitted from the light source and the emitted heat is further added to the main components of the EL device and, as a result, its temperature reaches 50° C. to 60° C. on the transparent insulating substrate 51. Moreover, since it is impossible to completely cure the resin for encapsulation 56 only by applying the UV to the resin for encapsulation 56, after the irradiation with the UV, heat with a temperature of 40° C. to 60° C. is added for about a half day to perform after-curing processing.

However, due to heat existing on the transparent insulating substrate 51 in the encapsulation process and heat produced by the after-curing process, a defect occurring on an interface of the organic light emitting layer 54 and the cathode 55 in an unstable state is increased. The occurrence of the defect means that an impurity level caused by a lattice defect or a like is formed in a region where an interface level is to be formed. The existence of the defect causes a path other than that through which a carrier flows originally to be produced and occurrence of the leakage current to be increased. Moreover, there is a danger that the cathode 55 is shorted to the anode 52. As a result, a characteristic of the organic EL device becomes unstable, causing an increase of defects. Moreover, since the UV light causes the increase in defects existing on the interface, when the UV light is applied, considerations are given to avoid application of the UV light to the main components of the organic EL device.

Therefore, to stabilize characteristics of the organic EL device by preventing the occurrence of the leakage current caused by heat in the encapsulation process, it is desirous to remove the defects before being encapsulated.

In the manufacturing of each of various electronic components, in order to achieve stable characteristics of the organic EL device, generally, aging processing is performed. For example, a semiconductor aging apparatus used in a test for an EPROM (Electrically Programmable Read Only Memory) is disclosed in Japanese Laid-open Patent Application No. Hei 1-191075. The semiconductor aging apparatus, as shown in FIG. 11, is so constructed that the aging is performed by applying light with wavelengths of more than 400 nm from a mercury lamp 63 attached outside a thermostatic storage oven 61 through an optical filter 64 to an EPROM substrate 62 mounted in the thermostatic storage oven 61 maintained at temperatures of 200° C. to 300° C. This causes an electron existing in a floating gate to be excited and the excited electron to be discharged beyond a barrier, thus improving a storage characteristic of the organic EL device.

A method of aging of an EL display adapted to stabilize light emission luminance of an EL display panel is disclosed in, for example, Japanese Laid-open Patent Application No. Hei 4-79193.

In the disclosed aging method of the EL display panel, as shown in FIG. 12, when the aging is performed, since the organic EL device has many cells (each of them has both the_electrodes 72 and 73), all the electrodes 72 and 73 are commonly connected, that is, one electrode 72 (for example, cathode) and the other electrode 73 (for example, anode) are commonly connected to the EL display panel 71 and a display voltage 74 fed from an alternating power source is applied between both the electrodes 72 and 73 to emit light and, at a same time, light having energy of more than 0.3 kW is applied to only a side of the EL display panel 71 from an aging light source 75 using a mercury lamp or a like. Thus, by combining irradiation of light and application of voltages, the aging is accelerated and time required for the aging is shortened.

However, the conventional aging processing disclosed above, since it is not intended to be used for aging of the organic EL device, has the following problems.

First, since the semiconductor aging processing disclosed in Japanese Laid-open Patent Application Hei 1-191075 is intended to be used for the EPROM being one of types of the semiconductor devices, it naturally uses the thermostatic storage oven 61 with its temperatures being maintained at 200° C. to 300° C. However, since the organic EL device has the organic light emitting layer 54 and is vulnerable to heat, it is not proper to use the above aging method for the organic EL device. That is, though, in the case of the organic EL device, the aging has to be preferably performed at ordinary temperatures, if the aging processing disclosed above is employed, as a result, the aging is performed at high temperature, which causes problems associated with heat, as described above. Moreover, since the aging processing disclosed above is intended to be applied to a test of the EPROM for screening, no consideration has been given to improvement of device characteristics by, for example, preventing the occurrence of the leakage current caused by heat in the encapsulation process, which presents a problem.

Next, in the aging processing disclosed in Japanese Laid-open Patent Application No. Hei 4-79193, display voltage fed from the alternating power source is applied between both the electrodes and, at the same time, the light using the mercury lamp is applied to the EL display panel. However, since the light energy used for the irradiation is as large as more than 0.3 kW, if it is employed in the aging for the organic EL device, the organic light emitting layer 54 degrades. Moreover, the application of the voltage is essential in the disclosed aging processing, however, since, in the manufacturing method of the organic EL device, almost all the processes have to be performed in an atmosphere of inert gas in order to prevent the degradation of the organic light emitting layer 54, the application of the voltage is impossible. In the aging processing disclosed in Japanese Laid-open Patent Application No. Hei 4-79193, since the aging is performed in order to achieve stabilization of light emission luminance, no consideration has been given to the improvement of device characteristics by, for example, preventing the occurrence of the leakage current caused by heat in the encapsulation process, as in the case of the aging processing disclosed in Japanese Laid-open Patent Application No. Hei 1-191075.

SUMMARY OF THE INVENTION

In view of the above, it is an object of the present invention to provide a method for manufacturing an organic EL device which is capable of preventing an occurrence of a leakage current caused by heat in an encapsulation process.

According to a first aspect of the present invention, there is provided a method for manufacturing an organic EL device for performing encapsulation by using a cap, after having formed its main components by sequentially stacking a first electrode, an organic layer containing at least an organic light emitting layer and a second electrode on a transparent insulating substrate, including:

a step of applying, before performing the encapsulation, light with a wavelength of a range of 300 nm to 500 nm to a displaying surface of the transparent insulating substrate on which the main components are formed.

In the foregoing, a preferable mode is one wherein the light is applied in light quantity of a range of 0.1 to 1000 $\mu W/cm^2$.

Also, a preferable mode is one wherein the light is applied during irradiation time of a range of 1 min. to 30 min.

Also, a preferable mode is one wherein the light is applied in an atmosphere containing oxygen.

According to a second aspect of the present invention, there is provided a method for manufacturing an organic EL device for performing encapsulation using a cap after having formed its main components on a transparent insulating substrate, the method including:

a process of forming, after having formed a transparent conductive film on the transparent insulating substrate, an anode by performing patterning so that the transparent conductive film has a desired shape;

a process of forming, after having put the transparent insulating substrate into a deposition apparatus having at least a light emitting material, an organic layer containing at least an organic light emitting layer on the anode;

a process of forming, after having formed the organic layer, a cathode on the organic layer;

a process of placing the transparent insulating substrate in a light irradiating apparatus and then applying light with a wavelength of 300 nm to 500 nm;

a process of applying light with a wavelength of 300 nm to 500 nm wherein light quantity is in a range of 0.1 to 1000 $\mu W/cm^2$;

a process of applying light with a wavelength of 300 nm to 500 nm wherein irradiation time is in a range of 1 min. to 30 min.; and a process of having the cap adhered on the transparent insulating substrate for encapsulation.

In the foregoing, a preferable mode is one wherein the light is applied in an atmosphere containing oxygen.

Also, a preferable mode is one wherein a vacuum evaporation apparatus is used as the deposition apparatus.

Also, a preferable mode is one wherein the light is applied at a temperature of less than about 60° C.

With the above configurations, optical annealing is performed, before being encapsulated, by applying light with the irradiation wavelength λ within a range of 300 nm to 500 nm to the transparent insulating substrate on which main components are formed and therefore interface between the organic film and cathode can be made stable. As a result, occurrence of leakage current caused by heat in an encapsulation process can be prevented.

BRIEF DESCRIPTION OF THE DRAWINGS

The above and other objects, advantages, and features of the present invention will be more apparent from the following description taken in conjunction with accompanying drawings in which:

FIG. 4 is a table showing rectification ratios obtained when an irradiation wavelength is changed in an application of light to the organic EL device manufactured by the method according to the first embodiment;

FIG. 5 is also a table showing rectification ratios obtained when the irradiation wavelength is further changed in the application of light to the organic EL device manufactured by the method according to the first embodiment;

FIG. 6 is a table showing rectification ratios obtained when a quantity of light is changed in an application of light to an organic EL device manufactured by a method according to a second embodiment;

FIG. 7 is also a table showing rectification ratios in a comparable example;

FIG. 8 is a table showing rectification ratios obtained when an irradiation time is changed in an application of light to an organic EL device manufactured by a method according to a third embodiment;

FIG. 9 is also a table showing rectification ratios in a comparable example;

DETAILED DESCRIPTION OF THE PREFERRED EMBODIMENTS

Best modes of carrying out the present invention will be described in further detail using various embodiments with reference to accompanying drawings.

First Embodiment

Figure 2:
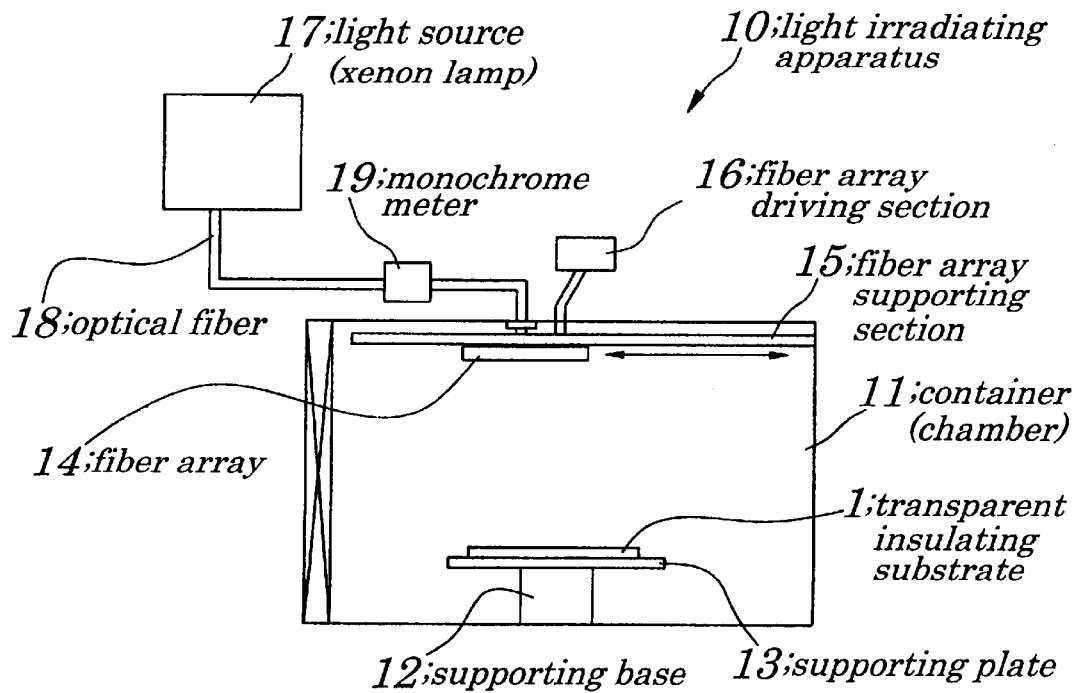
FIG. 2 is a schematic block diagram showing configurations of a light irradiating apparatus employed in main processes of manufacturing the organic EL device according to the first embodiment.
Figure 3:
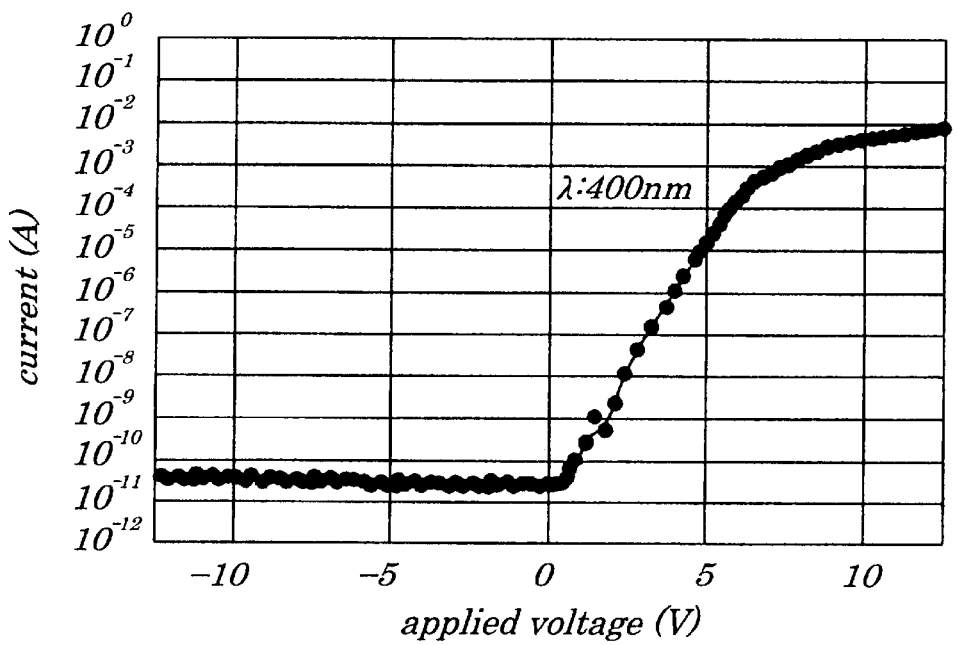
FIG. 3 is a graph showing one example of a rectification property of the organic EL device manufactured by the method according to the first embodiment.
Figure 10:
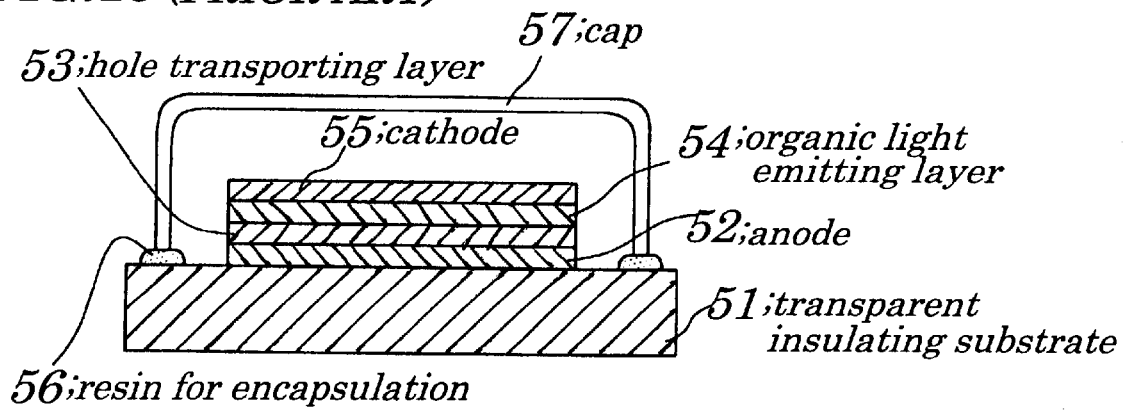
FIG. 10 is a schematic diagram showing configurations of a conventional organic EL device.
Figure 11:
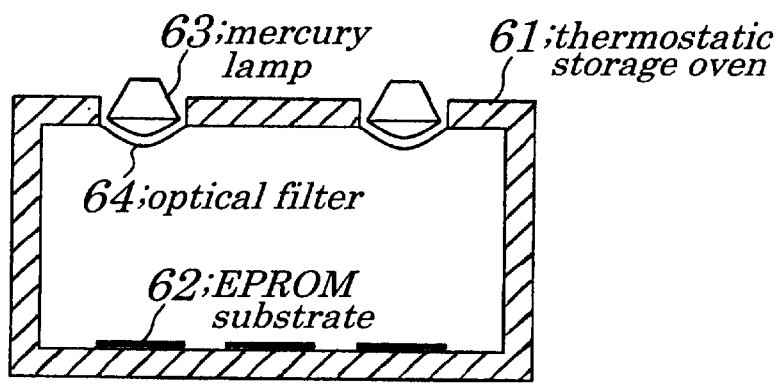
FIG. 11 is a schematic diagram showing configurations of a conventional semiconductor aging apparatus.
Figure 12:
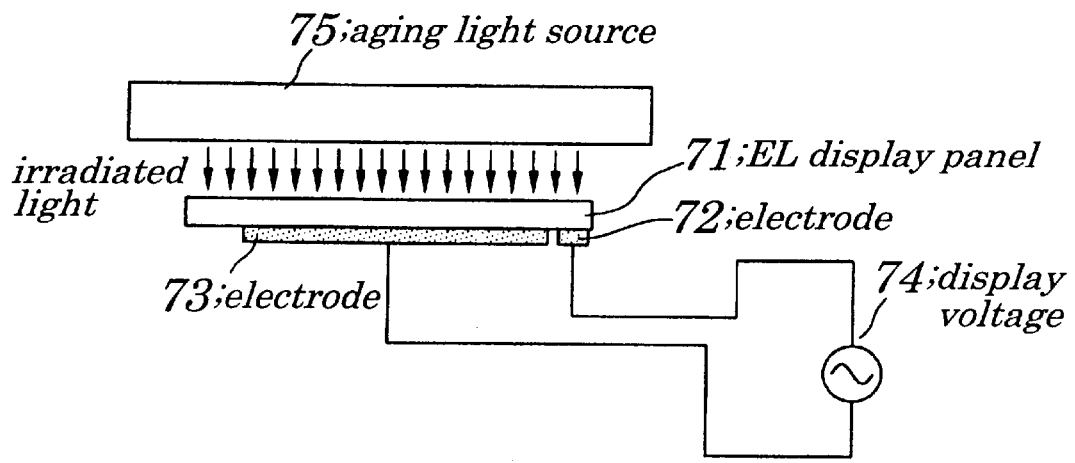
FIG. 12 is a schematic diagram explaining a method of aging of a conventional EL display panel.

FIGS. 1A to 1D are process diagrams showing a method for manufacturing an organic EL device in order of processes according to a first embodiment of the present invention. FIG. 2 is a schematic block diagram showing configurations of a light irradiating apparatus employed in main processes of manufacturing the organic EL device according to the first embodiment. FIG. 3 is a graph showing a rectification property of the organic EL device manufactured by the method according to the first embodiment. FIG. 4 is a table showing rectification ratios obtained when an irradiation wavelength is changed in the application of light to the organic EL device manufactured by the method according to the first embodiment. FIG. 5 is also a table showing rectification ratios obtained when the irradiation wavelength is further changed in the application of light to the organic EL device manufactured by the method according to the first embodiment.

The method for manufacturing the organic EL device of the first embodiment will be described in order of processes by referring to FIG. 1A to FIG. 2.

Figure 1A:
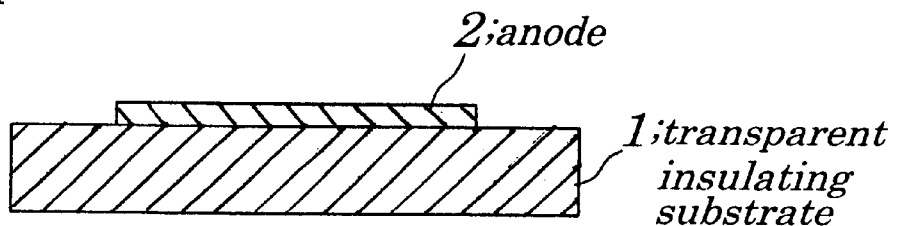
FIG. 1A to FIG. 1D are process diagrams showing a method for manufacturing an organic EL device in order of processes according to a first embodiment of the present invention.

First, as shown in FIG. 1A, an ITO film having a thickness of about 100 nm serving as a transparent conductive film is formed, by using a sputtering method, on a transparent insulating substrate 1 made of glass or a like. At this point, a sheet resistance of the ITO film is 10 ohm/square. Then, a patterning operation is performed using a known photolithography so that the ITO film has a desired shape in order to form an anode (first electrode). Here, the transparent insulating substrate 1 having the patterned ITO film is referred to as the "substrate 1". Then, the transparent insulating substrate 1 is cleaned with IPA (Isopropyl Alcohol) followed by UV ozone cleaning to perform a sufficient washing of a surface of the transparent insulating substrate 1.

Figure 1B:
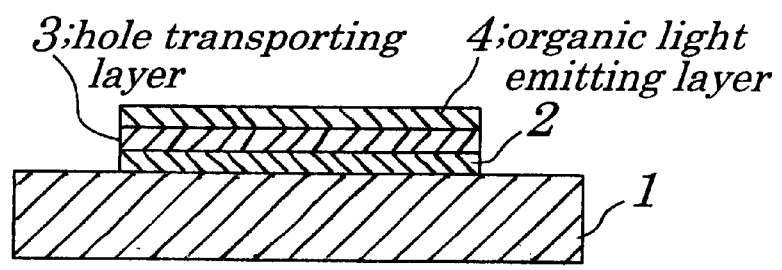

Next, as shown in FIG. 1B, a hole transporting layer 3 and then an organic light emitting layer 4 are sequentially formed on the anode 2. The formation of the hole transporting layer 3 and the organic light emitting layer 4 is carried out by the following ways.

First, one boat (first boat) made of molybdenum containing 100 mg of α-NPD [(N,N'-diphenyl)-N,N'-bis(1-naphthyl)-(1,1'-biphenyl-(4,4'-diamine)) as a hole transporting material and another boat (second boat) made of molybdenum containing 100 mg of $Alq_3$ [tris (8-quinolinolato aluminum complex)] as a light emitting material are arranged in a vacuum evaporation system in a manner that each of them is operated as a separate evaporation source. Next, after the transparent insulating substrate 1 has been put into the vacuum evaporation system, air within the vacuum evaporation system is exhausted until the vacuum therein reaches $2 \times 10^{-4}$ pascals, when heating of the first boat is then started. After the heating temperature has been controlled until an evaporation speed of the α-NPD in the first boat becomes a constant speed of 0.3 nm/sec, a shutter attached to an upper part of the vacuum evaporation system is opened to start the deposition of the α-NPD and at a time when its thickness reaches about 50 nm, the shutter is closed to terminate the deposition of the α-NPD.

Then, in a similar manner, after the heating temperature has been controlled until an evaporation speed of the $Alq_3$ in the second boat becomes a constant speed of 0.3 nm/sec, a shutter attached to an upper part of the vacuum evaporation system is opened to start the deposition of the $Alq^3$ and at a time when its thickness reaches about 55 nm, the shutter is closed to terminate the deposition of the $Alq^3$.

Thus, on the anode 2 are formed the hole transporting layer 3 made up of the α-NPD and the organic light emitting layer 4 made up of the $Alq^3$.

Figure 1C:
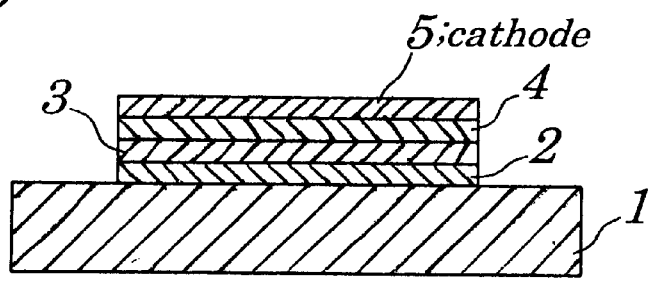

Next, as shown in FIG. 1C, on the organic light emitting layer 4 is formed a cathode 5(second electrode). The formation of the cathode 5 is carried out by the following way.

After the formation of the organic light emitting layer 4, the transparent insulating substrate 1 is moved into another vacuum evaporation system connected to the above vacuum evaporation system in a state in which the vacuum is still maintained. A boat made of molybdenum containing 1 g of AlLi (aluminum lithium) alloy being connected to a resistor heating source is arranged in advance in the another vacuum evaporation system. After air within the vacuum evaporation system is exhausted until vacuum therein reaches $4 \times 10^{-4}$ pascals, the boat is heated by the resistor heating source. After the heating temperature has been controlled until an evaporation speed of the AlLi alloy in the second boat becomes a constant speed of 0.4 nm/sec, a shutter attached in advance to an upper part of the vacuum evaporation system is opened to start the deposition of the AlLi alloy and at a time when its thickness reaches about 60 nm, the shutter is closed to terminate the deposition of the AlLi alloy.

Thus, on the organic light emitting layer 4 is formed the cathode 5 made of the AlLi alloy. As a result, on the transparent insulating substrate 1 are now formed main components of the EL device including the anode 2, hole transporting layer 3, organic light emitting layer 4, and cathode 5.

Next, the transparent insulating substrate 1 is put in a light irradiating apparatus 10 shown in FIG. 2 while being kept in the vacuum state.

The light irradiating apparatus 10 of the embodiment, as shown in FIG. 2, includes a container 11 (chamber), a supporting base 12 placed at a bottom of the container 11, a supporting plate 13 used to support the transparent insulating substrate 1 placed at a top of the supporting base 12, a fiber array 14 used to apply light to the transparent insulating substrate 1 and placed in an upper portion of the container 11, a fiber array supporting section 15 used to support the fiber array 14, a fiber array driving section 16 used to control a position in a horizontal direction of the fiber array 14, a light source 17 using, for example, a xenon lamp, an optical fiber 18 used to transfer light from the light source 17 to the fiber array 14 and a monochrome meter 19 placed on the way to the optical fiber 18.

After the transparent insulating substrate 1 is placed on the supporting plate 13 in the container 11 of the light irradiating apparatus 10 in a manner that the transparent insulating substrate 1 is positioned on an upper side of the supporting plate 13, that is, a light emitting side (display side) of the transparent insulating substrate 1 faces the fiber array 14, with an atmosphere of $N_2$ (nitrogen) gas maintained in the container 11, the pressure within the container 11 is restored to a level of an atmospheric pressure. Next, light is fed from the light source 17 through the optical fiber 18 to apply the light with a wavelength of 300 nm to 500 nm to the light exiting side (display side) of the transparent insulating substrate 1 from the fiber array 14 for one minute. That is, by applying only the light whose wavelength is within 300 nm to 500 nm, optical annealing is carried out. At this point, the quantity of light is adjusted so as to be 0.1 $\mu W/cm^2$. Moreover, the ambient temperature is kept at not more than about 60° C. Furthermore, the position of the fiber array driving section 16 is controlled so that the fiber array 14 can surely apply the light to the transparent insulating substrate 1.

Figure 1D:
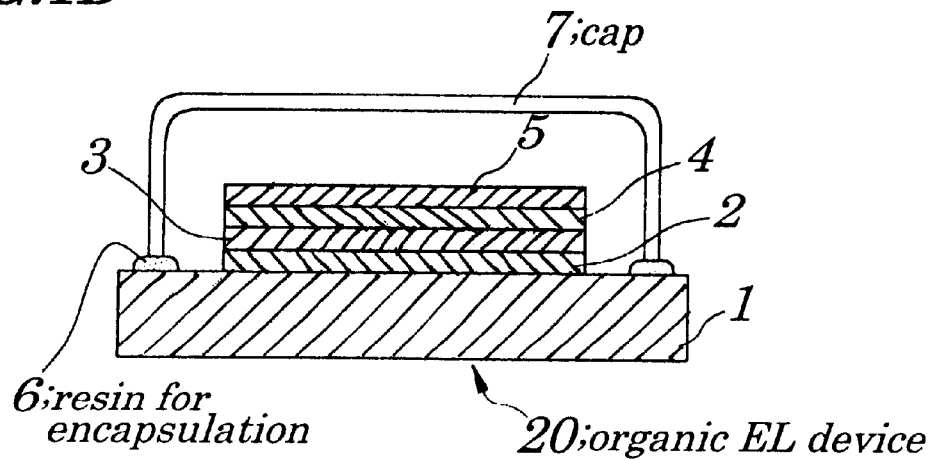

Next, after having moved the transparent insulating substrate 1 to an encapsulating room (not shown), as shown in FIG. 1D, by causing, for example, a cap 7 made of glass to be adhered to the transparent insulating substrate 1 to encapsulate the anode 2, hole transporting layer 3, organic light emitting layer 4 and cathode 5, via the UV curable resin for encapsulation 6, that is, with the resin 6 for encapsulating interposed between the cap 7 and the transparent insulating substrate 1, an organic EL device 20 is now obtained. When the resin for encapsulation 6 is cured in encapsulating process, the UV light is shaded from the anode 2, hole transporting layer 3, organic light emitting layer 4, and cathode 5, and is applied only to the resin for encapsulation 6.

Next, rectification properties of the organic EL device 20 manufactured in accordance with the method for manufacturing the organic EL device 20 of the embodiment are measured by using a semiconductor parameter analyzer. Measurements are made by applying a forward voltage and a reverse voltage between the anode 2 and the cathode 5 of the organic EL device 20. A light emitting area of the organic EL device 20 is 2 mm².

FIG. 3 is the diagram showing one example of the rectification properties of the organic EL 20 device obtained by the above measurements. In the example, light having an irradiation wavelength λ being 400 nm is applied. A current is plotted as ordinate and an applied voltage as abscissa. When a ratio of a forward current "If" at a voltage of a forward applied voltage being 10V to a reverse current "Ir" at a voltage of a reverse applied voltage being 10V is defined as a rectification ratio (If/Ir), since almost no reverse current Ir flows, it is confirmed by an experiment that the rectification ratio being as large as $1.5 \times 10^8$ can be obtained, thus exhibiting an excellent rectification property.

FIG. 4 shows the rectification ratio obtained when the irradiation wavelength λ of light is changed in various ways within a range of 300 nm to 500 nm in the above example. Moreover, FIG. 5 shows the rectification ratio used as a comparable example, obtained when the irradiation wavelength λ of light is changed in various ways outside the range of 300 nm to 500 nm in the application of light to the organic EL device manufactured by almost the same manufacturing method as in the embodiment.

In FIG. 4, item No. 1 in the table shows a case where the irradiation wavelength λ is set at 300 nm and the obtained rectification ratio is $1.2 \times 10^8$. Similarly, item No.2 shows a case where the irradiation wavelength λ is set at 350 nm and the obtained rectification ratio is $2.0 \times 10^8$, item No.3 shows a case where the irradiation wavelength λ is set at 450 nm and the obtained rectification ratio is $2.4 \times 10^8$, and item No.4 shows a case where the irradiation wavelength λ is set at 500 nm and the obtained rectification ratio is $3.0 \times 10^8$. In any case, the rectification ratio is high.

On the other hand, in FIG. 5, item No. 1 in the table shows a case where the irradiation wavelength λ is set at 200 nm and the obtained rectification ratio is $5.0 \times 10^4$. Similarly, item No.2 shows a case where the irradiation wavelength λ is set at 250 nm and the obtained rectification ratio is $4.6 \times 10^4$, item No.3 shows a case where the irradiation wavelength λ is set at 550 nm and the obtained rectification ratio is $4.2 \times 10^7$ and item No.4 shows a case where the irradiation wavelength λ is set at 600 nm and the obtained rectification ratio is $2.2 \times 10^5$. These rectification ratios obtained in FIG. 5 are smaller than those obtained in FIG. 4 by not less than an order of magnitude, which shows the rectification characteristics have become worse.

The comparison between the rectification ratios in FIG. 4 and FIG. 5 shows that, by setting the irradiation wavelength λ within the range of 300 nm to 500 nm, in particular, large rectification ratio can be obtained. It can be thought that the reason is because an occurrence of the leakage current caused by heat occurring in the encapsulation process can be prevented when the irradiation wavelength λ is set within the range of 300 nm to 500 nm. On the other hand, if the irradiation wavelength λ is set outside the range of 300 nm to 500 nm, since the occurrence of the leakage current caused by heat in the encapsulation process cannot be prevented, it is impossible to make the rectification ratio large.

If the irradiation wavelength λ is smaller than 300 nm, since decomposition of the light emitting layer and/or structural changes in the light emitting layer are remarkable, quantum efficiency degrades greatly and the surface of the film is roughened due to crystallization of the thin film, thus causing easy concentration of electric field. If the irradiation wavelength λ is larger than 500 nm, it is too large to be effective as an exciting wavelength of the light emitting layer.

As described above, the reason why the organic EL device 20 manufactured by the method of the embodiment exhibits an excellent rectification property is that, by setting the irradiation wavelength λ of the light within the range of 300 nm to 500 nm and by applying the light to the transparent insulating substrate 1 to perform optical annealing before being encapsulated, the increase of defects occurring at the originally unstable interface between the organic light emitting layer 4 and the cathode 5 can be inhibited, thus changing the unstable state of the interface to the stable state. This enables the characteristic of the organic EL device 20 to be stable, as a result, decreasing failures. Moreover, simply by applying the light, these aims can be sufficiently achieved.

Thus, according to the method for manufacturing the organic EL device 20 of the embodiment, since optical annealing is performed, before being encapsulated, by applying the light with the irradiation wavelength λ being 300 nm to 500 nm to the transparent insulating substrate 1 on which the main components having the anode 2, hole transporting layer 3, organic light emitting layer 4 and cathode 5 are formed, it is possible to stabilize the state of the interface between the organic light emitting layer 4 and the cathode 5. Therefore, the occurrence of the leakage current caused by heat in the encapsulation process can be prevented.

Second Embodiment

FIG. 6 is a table showing rectification ratios obtained when quantity of light is changed in an application of light to an organic EL device manufactured by a method according to a second embodiment. The method for manufacturing the organic EL device of the second embodiment differs greatly from that in the first embodiment in that rectification ratios are obtained when irradiation wavelength λ is constant and the quantity of light is changed within a range of 0.1 $\mu W/cm^2$ to 1000 $\mu W/cm^2$ in the application of light to the organic EL device.

That is, in the second embodiment, the organic EL device is manufactured in almost the same process as in the first embodiment and, when light irradiation is performed in the light irradiating apparatus, light with an irradiation wavelength λ of 400 nm is applied and its quantity of light is changed within the range of 0.1 $\mu W/cm^2$ to 1000 $\mu W/cm^2$.

FIG. 6 shows the rectification ratio obtained when the quantity of light is changed within the range of 0.1 $\mu W/cm^2$ to 1000 $\mu W/cm^2$ in the embodiment. FIG. 7 shows the rectification ratio used as a comparable example, obtained when the quantity of light is changed in various ways outside the range of 0.1 $\mu W/cm^2$ to 1000 $\mu W/cm^2$ in the organic EL device manufactured by almost the same manufacturing method as in the second embodiment.

In FIG. 6, item No. 1 in the table shows a case where the quantity of light is set at 0.1 $\mu W/cm^2$ and the obtained rectification ratio is $1.0 \times 10^8$. Similarly, item No. 2 shows a case where the quantity of light is set at 1.0 $\mu W/cm^2$ and the obtained rectification ratio is $1.0 \times 10^8$, item No. 3 shows a case where the quantity of light is set at 10 $\mu W/cm^2$ and the obtained rectification ratio is $2.0 \times 10^8$, item No. 4 shows a case where the quantity of light is set at 100 $\mu W/cm^2$ and the obtained rectification ratio is $2.2 \times 10^8$, and item No. 5 shows a case where the quantity of light is set at 1000 $\mu W/cm^2$ and the obtained rectification ratio is $3.2 \times 10^8$. In any case, the rectification ratio is high.

On the other hand, in FIG. 7, item No. 1 in the table shows a case where the quantity of light is set at 0.01 $\mu W/cm^2$ and the obtained rectification ratio is $4.4 \times 10^6$. Similarly, item No. 2 shows a case where the quantity of light is set at 10000 $\mu W/cm^2$ and the obtained rectification ratio is $5.2 \times 10^4$, item No. 3 shows a case where the quantity of light is set at 100000 $\mu W/cm^2$ and the obtained rectification ratio is $6.6 \times 10^2$. These rectification ratios obtained in FIG. 7 are much smaller than those obtained in FIG. 6, which shows the rectification characteristics have become worse. Moreover, when the quantity of light is set to less than 0.1 $\mu W/cm^2$ as in the case of the above item No.1, since the quantity of light is small and a photovoltaic force is weak, that is, the number of frequencies of light excitation is small, aging effect becomes low.

As is apparent from FIGS. 6 and 7, by setting the quantity of light within the range of 0.1 $\mu W/cm^2$ to 1000 $\mu W/cm^2$ in particular, it is possible to obtain the large rectification ratio. It can be thought that the reason for that is because occurrence of the leakage current caused by heat occurring in the encapsulation process can be prevented when the quantity of light is set within the range of 0.1 $\mu W/cm^2$ to 1000 $\mu W/cm^2$. On the other hand, if the quantity of light is set outside the range of 0.1 $\mu W/cm^2$ to 1000 $\mu W/cm^2$, since the occurrence of the leakage current caused by heat in the encapsulation process cannot be prevented, it is impossible to make the rectification ratio large.

As described above, the reason why the organic EL device manufactured by the method of the embodiment exhibits an excellent rectification property is that, by setting the quantity of light within the range of 0.1 $\mu W/cm^2$ to 1000 $\mu W/cm^2$ and by applying the light to a transparent insulating substrate 1 before being encapsulated, the increase of defects occurring at the originally unstable interface between an organic light emitting layer 4 and a cathode 5 can be inhibited, thus changing the unstable state of the interface to the stable one. This enables the characteristic of the organic EL device to be stable, as a result, decreasing failures. Moreover, simply by applying the light, these aims can be sufficiently achieved.

Thus, according to the second embodiment, almost the same effects as obtained in the first embodiment can be achieved.

Third Embodiment

FIG. 8 is a table showing rectification ratios obtained when irradiation time is changed in an application of light to an organic EL device manufactured by a method according to a third embodiment. The method for manufacturing the organic EL device of the third embodiment differs greatly from that in the first embodiment in that the rectification ratios are obtained when the irradiation time is changed within a range of 1 min. to 30 min. with a irradiation wavelength λ and a quantity of light being kept constant in the application of light to the organic EL device.

That is, in the third embodiment, the organic EL device is manufactured in almost the same processes as those in the first embodiment shown in FIG. 1 and light irradiation is performed, in a light irradiating apparatus shown in FIG. 2 to the above manufactured organic EL device using light with the irradiation wavelength λ of 400 nm and in the light quantity of 1 $\mu W/cm^2$ by changing the irradiation time within a range of 1 min. to 30 min. The rectification ratios obtained when the irradiation time is changed within a range of 1 min. to 30 min. in the application of light are shown in FIG. 8. Moreover, FIG. 9 shows the rectification ratio used as a comparable example, obtained when the irradiation time is changed in various ways outside the range of 1 min. to 30 min. in the application of light to the organic EL device manufactured by almost the same manufacturing method as in the third embodiment.

In FIG. 8, item No. 1 in the table shows a case where the irradiation time is set at 1 min. and the obtained rectification ratio is $1.2 \times 10^8$. Similarly, item No.2 shows a case where the irradiation time is set at 3 min. and the obtained rectification ratio is $1.9 \times 10^8$, item No.3 shows a case where the irradiation time is set at 5 min. and the obtained rectification ratio is $2.2 \times 10^8$ and item No.4 shows a case where the irradiation time is set at 10 min. and the obtained rectification ratio is $3.6 \times 10^8$, item No.5 shows a case where the irradiation time is set at 20 min. and the obtained rectification ratio is $2.8 \times 10^8$, and item No.6 shows a case where the irradiation time is set at 30 min. and the obtained rectification ratio is $3.8 \times 10^8$. In any case, the rectification ratio is high.

On the other hand, in FIG. 9, item No. 1 in the table shows a case where the irradiation time is set at 50 min. and the obtained rectification ratio is $3.2 \times 10^6$, item No.2 shows a case where the irradiation time is set at 90 min. and the obtained rectification ratio is $8.2 \times 10^5$, item No.3 shows a case where the irradiation time is set at 120 min. and the obtained rectification ratio is $4.2 \times 10^4$. These rectification ratios obtained in FIG. 9 are remarkably smaller than those obtained in FIG. 8, which shows the rectification characteristics become worse.

As is apparent from FIG. 8 and FIG. 9, by setting the irradiation time within a range of 1 min. to 30 min., in particular, a greater rectification ratio can be obtained. It can be thought that the reason is because occurrence of leakage current caused by heat occurring in an encapsulation process can be prevented when the irradiation time is set within the range of 1 min. to 30 min. On the other hand, if the irradiation time is set outside the range of 1 min. to 30 min., since the occurrence of the leakage current caused by heat in the encapsulation process cannot be prevented so much, it is impossible to make the rectification ratio large.

As described above, the reason why the organic EL device manufactured by the method of the third embodiment exhibits an excellent rectification property is that, by setting the irradiation time within the range of 1 min. to 30 min. and by applying the light to a transparent insulating substrate 1 before being encapsulated, the increase of defects occurring at the originally unstable interface between an organic light emitting layer 4 and a cathode 5 can be inhibited, thus changing the unstable state of the interface to the stable one. This enables the characteristic of the organic EL device to be stable, as a result, decreasing failures. Moreover, simply by applying the light, these aims can be sufficiently achieved.

Thus, according to the third embodiment, the same effects obtained in the first embodiment can be achieved.

Fourth Embodiment

A method for manufacturing an organic EL device of the fourth embodiment differs greatly from that in the first embodiment in that an atmosphere of a gas employed at a time of the irradiation of light in the above embodiments is changed to an atmosphere of mixed gas of nitrogen and oxygen. That is, in the fourth embodiment, to perform optical annealing by using a light irradiating apparatus 10 shown in FIG. 2 in the first embodiment, the atmosphere of the mixed gas, in which the nitrogen gas and oxygen gas are mixed so that a capacity ratio is 2:1, in a container 11 having a transparent insulating substrate 1 is used. The processes other than above are almost the same as those in the first embodiment and their descriptions are omitted accordingly.

According to the embodiment, by keeping the transparent insulating substrate 1 in the atmosphere containing oxygen while the optical annealing is being performed, the oxygen enters unstable defect portions existing at an interface between an organic light emitting film 4 and a cathode 5 to perform an auxiliary action for stabilization of the defect. In the organic EL device manufactured by the method employed in the fourth embodiment, no reverse direction current is observed at a time when a reverse direction voltage is applied and, as a result, a rectification ratio of $5.5 \times 10^9$ can be obtained.

Thus, according to the fourth embodiment, the same effects obtained in the first embodiment can be achieved.

Additionally, according to the fourth embodiment, by performing the optical annealing at the atmosphere containing oxygen, it is possible to stabilize defects existing at the interface between the organic light emitting layer 4 and cathode 5.

It is apparent that the present invention is not limited to the above embodiments but may be changed and modified without departing from the scope and spirit of the invention. For example, in the above embodiment, ITO is used as an anode formed on the transparent insulating substrate 1. However, the present invention is not limited to the ITO so long as it is a transparent conductive material, that is, for example, other materials for electrodes such as $SnO_2$ (tin oxide) may be used. As the cathode 5, not only an AlLi alloy but also other materials for the electrode such as Al, MgAg, or a like may be used. As a hole transporting material, in addition to an α-NPD, for example, bis (di (p-tolyl) aminophenyl-1,1-cylohexane, N-N'-diphenyl-N,N'-bis(3-methylphenyl)-1,1'-biphenyl-4,4'-diamine, N,N'-diphenyl-N,N-bis(1-naphthyl)-(1,1'-biphenyl)-4,4'-diamine, star-burst type molecule, or a like may be used.

Moreover, in the above embodiments, the main components of the organic EL device have the anode, hole transporting layer, organic light emitting layer, and cathode. However, the main components may have the anode, organic light emitting layer, and cathode; having the anode, hole transporting layer, organic light emitting layer, electron transporting layer, and cathode; having the anode, organic light emitting layer, electron transporting layer, and cathode. Any organic layer may be used so long as it contains the organic light emitting layer.

What is claimed is:

1. A method for manufacturing an organic electroluminescence device for performing encapsulation by using a cap, after having formed its main components by sequentially stacking a first electrode, an organic layer containing at least an organic light emitting layer and a second electrode on a transparent insulating substrate, comprising:

a step of applying, before performing said encapsulation, light with a wavelength within a range of 300 nanometers to 500 nanometers to a light exiting surface of said transparent insulating substrate on which said main components are formed.

2. The method for manufacturing the organic electroluminescence device according to claim 1, wherein said light is applied in light quantity within a range of 0.1 to 1000 $\mu W/cm^2$.

3. The method for manufacturing the organic electroluminescence device according to claim 1, wherein said light is applied during an irradiation time within a range of 1 minute to 30 minutes.

4. The method for manufacturing the organic electroluminescence device according to claim 2, wherein said light is applied during irradiation time within a range of 1 minute to 30 minutes.

5. The method for manufacturing the organic electroluminescence device according to claim 1, wherein said light is applied at an atmosphere containing oxygen.

6. The method for manufacturing the organic electroluminescence device according to claim 2, wherein said light is applied at an atmosphere containing oxygen.

7. The method for manufacturing the organic electroluminescence device according to claim 3, wherein said light is applied at an atmosphere containing oxygen.

8. The method for manufacturing the organic electroluminescence device according to claim 4, wherein said light is applied at an atmosphere containing oxygen.

9. A method for manufacturing an organic eletroluminescence device for performing encapsulation using a cap after having formed its main components on a transparent insulating substrate, said method comprising:

a process of forming, after having formed a transparent conductive film on said transparent insulating substrate, an anode by performing patterning so that said transparent conductive film has a desired shape;

a process of forming, after having put said transparent insulating substrate into a deposition apparatus having at least a light emitting material, an organic layer containing at least an organic light emitting layer on said anode;

a process of forming, after having formed said organic layer, a cathode on said organic layer;

a process of placing said transparent insulating substrate in a light irradiating apparatus and then applying light with a wavelength within a range of 300 nm to 500 nm in light quantity within a range of 0.1 to 1000 $\mu W/cm^2$ for irradiation time of 1 min. to 30 min.; and a process of having said cap adhered on said transparent insulating substrate for encapsulation.

10. The method for manufacturing the organic eletroluminescence device according to claim 9, wherein said light is applied at an atmosphere containing oxygen.

11. The method for manufacturing the organic eletroluminescence device according to claim 9, wherein a vacuum evaporation apparatus is used as said deposition apparatus.

12. The method for manufacturing the organic eletroluminescence device according to claim 10, wherein a vacuum evaporation apparatus is used as said deposition apparatus.

13. The method for manufacturing the organic eletroluminescence device according to claim 1, wherein said light is applied at a temperature of not more than about 60 centigrade.

* * * * *